United States Patent
Feldmeier

(10) Patent No.: US 7,257,670 B2
(45) Date of Patent: Aug. 14, 2007

(54) MULTIPURPOSE CAM CIRCUIT

(75) Inventor: David C. Feldmeier, Redwood City, CA (US)

(73) Assignee: Micron Technology, Inc., Boise, ID (US)

(*) Notice: Subject to any disclaimer, the term of this patent is extended or adjusted under 35 U.S.C. 154(b) by 233 days.

(21) Appl. No.: 10/463,540

(22) Filed: Jun. 18, 2003

(65) Prior Publication Data

US 2004/0260867 A1    Dec. 23, 2004

(51) Int. Cl.
*G06F 12/00* (2006.01)
(52) U.S. Cl. .................................... 711/108; 711/5
(58) Field of Classification Search ................ 711/108
See application file for complete search history.

(56) References Cited

U.S. PATENT DOCUMENTS

| | | | |
|---|---|---|---|
| 5,930,359 A * | 7/1999 | Kempke et al. ............ 713/160 |
| 6,148,364 A | 11/2000 | Srinivasan et al. | |
| 6,230,236 B1 * | 5/2001 | Schultz et al. ............ 711/108 |
| 6,240,485 B1 * | 5/2001 | Srinivasan et al. ......... 711/108 |
| 6,301,636 B1 * | 10/2001 | Schultz et al. ............ 711/108 |
| 6,317,350 B1 | 11/2001 | Pereira et al. | |
| 6,493,793 B1 * | 12/2002 | Pereira et al. ............ 711/108 |
| 6,693,814 B2 * | 2/2004 | McKenzie et al. ........... 365/49 |
| 2003/0009618 A1 * | 1/2003 | Regev et al. ............. 711/108 |
| 2004/0015652 A1 * | 1/2004 | Park et al. .............. 711/108 |

OTHER PUBLICATIONS

Tsunemasa Hayashi and Toshiaki Miyazaki, "High-Speed Table Lookup Engine for IPv6 Longest Prefix Match", 1999 Global Telecommunications Conference. © 1999 IEEE. pp. 1576-1581.*
MUAA Routing Co-Processor (RCP) Family, Music Semiconductors Data Sheet, Oct. 11, 2001, Rev. 4, 18 pages.

* cited by examiner

*Primary Examiner*—Brian R. Peugh
*Assistant Examiner*—Jesse Diller
(74) *Attorney, Agent, or Firm*—Dickstein Shapiro LLP

(57) ABSTRACT

A content addressable memory (CAM) device for use in various sizes of systems while requiring minimal circuitry to enlarge the size of the prioritization circuitry. In smaller systems, the CAM device determines the highest priority CAM device having a match. In larger systems, an external logic device determines the highest priority CAM device having a match and then provides that information to each CAM device in the system. In both smaller and larger systems the CAM device determines if it is the highest priority CAM device having a match. In accordance with an exemplary embodiment of the invention, the CAM device needs only minimal programming to be configured to be utilized in either a larger or smaller system.

31 Claims, 15 Drawing Sheets

MULTIPURPOSE CAM CIRCUIT

FIELD OF THE INVENTION

The present invention relates generally to semiconductor memory devices and, more particularly to cascading content addressable memory (CAM) devices.

BACKGROUND OF THE INVENTION

An essential semiconductor device is semiconductor memory, such as a random access memory (RAM) device. A RAM allows a memory circuit to execute both read and write operations on its memory cells. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address.

In a CAM, however, data is stored in locations in a somewhat random fashion. The locations can be selected by an address bus, or the data can be written into the first empty memory location. Every location has at least one status bit that keeps track of whether the location is storing valid information in it or is empty and available for writing.

Once information is stored in a memory location, it is found by comparing every word in memory with data in the comparand register. When the content stored in the CAM memory location does not match the data in the comparand register, the local match detection circuit returns a no match indication. When the content stored in the CAM memory location matches the data in the comparand register, the local match detection circuit returns a match indication, e.g., a match flag. If one or more local match detection circuits return a match indication, the CAM device returns a "match" indication. Otherwise, the CAM device returns a "no-match" indication. In addition, the CAM may return the identification of the address location in which the desired data is stored or one of such addresses if more than one address contained matching data. Furthermore, if there is more than one match found, the CAM may return a multi-match signal, e.g., a multi-match flag. Thus, with a CAM, the user supplies the data and gets back an address if there is a match found in memory.

FIG. 1 shows a conventional CAM device 120 having a CAM bank 130, an address generator 140 and a priority encoder 150. The CAM bank 130 includes match detection circuits (not shown) that carry out the above-described match detection operation by comparing stored bits with comparand bits. The address generator 140 is coupled to the CAM bank 130 through line 145 and provides the address data corresponding to a particular memory location storing bits that match those in the comparand. A comparand data register 110, which stores the data being sought in the CAM, is coupled to CAM bank 130 through line 115.

The CAM bank 130 is also coupled to a priority encoder 150 through line 125 which determines and outputs the highest priority address that corresponds to the stored matching data within the CAM bank 130. Further, the priority encoder 150 outputs through line 131 then through line 135 a signal, e.g., a match flag signal, indicating whether a match detection circuit within the CAM bank 130 found a match between comparand data and stored data. As the CAM bank 130 may have more than one match the priority encoder 150 may also output, through line 131 then line 135, or through a separate line (not shown), another signal, e.g., a multi-match flag, indicating that multiple matches (i.e., multi-match) have been found. When a match is found in the CAM device 120, the CAM device 120 also outputs an address signal via line 155 corresponding to the highest priority address within the CAM device 120 that stored the matching data.

There are times when it is desirable to quickly search more words than are stored within a CAM bank 130. One solution is to cascade several CAM devices 120 to behave as a single CAM device that is larger than can be physically realized on a single chip. It is desirable that cascaded CAM devices 120 behave like a single CAM device 120, however, several problems can occur when cascading CAM devices.

One problem with cascading CAM devices 120 is that more than one of the cascaded CAM devices 120 may indicate a match, but only a single result is needed. If the cascaded CAM devices 120 are not controlled, then each of the CAM devices 120 having a match with the comparand data will attempt to return a result. The problem arises when a CAM device 120 having a relatively low priority attempts to return a result while a CAM device 120 having a relatively high priority is attempting to return a result at the same time. Therefore, a method for prioritizing cascaded CAM devices 120 has been implemented to indicate only the highest priority CAM device 120 having a match so that the highest priority CAM device 120 with a match provides its match results downstream.

A conventional cascaded CAM system 200 is shown is FIG. 2. As seen in FIG. 2, a cascaded CAM system 200 is implemented in the prior art by forming a "daisy" chain of CAM devices 220. In this embodiment, the highest priority CAM device 220 is the top-most CAM device 220 and the lowest priority CAM device 220 is the lowest CAM device 220. Each CAM device 220 has a respective match flag input pin 224 and a match flag output pin 225 (although only one of each type of pin is shown in FIG. 2).

The match flag output pin 225 of each CAM device is coupled to the match flag input pin 224 of the next CAM device 220. The first CAM device 220 in the chain, which may represent the highest priority addresses (e.g., lowest CAM index), has its match flag input pin 224 connected to a predetermined logic level external to the CAM device 220 to indicate that there is no previous CAM device. The match output pin 225 of the last CAM device 220 in the cascaded chain provides a system match flag 237, i.e., a global match flag, indicative of match conditions in the cascaded CAM device 220. Each CAM device 220 is coupled to receive data from the comparand register on line 115 and to send output data to a common data output bus 265 through a respective output line 155. Although not shown, a multi-match signal may also be cascaded through the CAM system 200 in a manner similar to the cascade of the match flag signal.

FIG. 3 shows one of the cascaded CAM devices 220 of FIG. 2 in greater detail. As seen in FIG. 3, each CAM device 220 is similar to CAM device 120 (of FIG. 1) but also includes a match priority encoder 260 and register 270. The match priority encoder 260 is used to prioritize CAM devices 220 that indicate a match. Match priority encoder 260 is coupled to and receives information through line 262 from another CAM device 220 coupled to match flag input pin 224. The input from match flag input pin 224 is coupled to the output of a match priority encoder 260 from a previous CAM device 220. Match priority encoder 260 also is coupled to and provides signal information, e.g., match flag signal and possibly multi-match signals, to pin 225 through line 261 and then from output pin 225 to the next CAM device 220 through line 135. As indicated above, the lowest priority CAM device 220 provides a match flag signal, which serves as the global match flag signal for the cascaded CAM configuration through line 237.

The priority encoder 150 is coupled and provides data to the register 270. If at least one match occurs in the match detection circuits of CAM device 220, then the priority encoder 150 determines the highest priority matching data and provides the address corresponding to that matching data to register 270 through line 253 where it is stored. Match priority encoder 260 is also coupled to register 270 through line 264. If match priority encoder 260 determines that the CAM device 220 is the highest priority CAM device 220 then match priority encoder 260 provides a signal, e.g., an enable signal, to register 270 to indicate thus. When register 270 receives the enable signal from match priority encoder 260, then register 270 provides the data stored at register 270 to line 155 which provides the address data to an output bus or a downstream circuit. Typically, each CAM device 220 contains the same range of addresses and therefore, high order address bits (or bit) are need to distinguish to match from a CAM with high priority and a match from a CAM with lower priority. Accordingly, register 270 may store not only the address of the matching word, but also these high order bits (or bit) to identify the CAM with priority.

With reference to FIGS. 2 and 3, the comparand data is provided on line 115 to each CAM device 220. In response to a search instruction, each CAM device 220 compares the comparand data with data stored in its respective CAM bank 130. If a priority encoder 150 detects a match between the comparand data and data stored in its CAM bank 130, priority encoder 150 sends a signal through line 231 to match priority encoder 260 indicating a match. If no match is found in CAM bank 130, then priority encoder 150 sends a signal to match priority encoder 260 indicating no match. Although shown as one line, line 125 is representative of a plurality of lines 125 between CAM block 130 and priority encoder 150. Match priority encoder 260 receives an input signal on line 262 from match flag input pin 224. If a CAM device 220 is the highest priority CAM device 220 in the cascaded CAM system 200, then a fixed, pre-programmed input signal is always provided to the input pin 224 of the CAM device 220. The pre-programmed input signal is set equivalent to a no-match signal and enables the highest priority CAM device 220 to determine if it is the highest priority CAM device 220 having a match (as described in greater detail below). If CAM device 220 is not the highest priority CAM device, then the signal input to the CAM device 220 from its match flag input pin 224 is the output from the match flag output pin 225 of the previous—the next higher—CAM device 220.

If the signal input by CAM device 220 from its match flag input pin 224 indicates a match, e.g., that a previous CAM device 220 had a match, then match priority encoder 260 provides a signal indicating a match on line 261 to its match flag output pin 225. If the signal input to CAM device 220 from its match flag input pin 224 indicates no match, i.e., that no prior CAM device 220 had a match, then match priority encoder 260 checks the signal provided by its priority encoder 150. If the signal provided by its priority encoder 150 indicates a match has been found, then match priority encoder 260 provides a signal indicating a match on line 261. If the signal provided by its priority encoder 150 indicates no match has been found, then match priority encoder 260 provides a signal indicating no match on line 261.

The highest priority CAM device 220 is at the top of the cascaded CAM system 200 (in FIG. 2) and the lowest priority CAM device 220 is at the bottom of the cascaded CAM system 200. The highest priority CAM device 220 having a match is determined in a top down process. The inherent layout architecture of the cascaded CAM system 200 prioritizes the CAM devices. For example, if a first CAM device 220 has a match, then the first CAM device 220 provides a signal indicating a match to match flag output pin 225. If the first CAM device 220 does not have a match, then the first CAM device 220 provides a signal indicating no-match to match flag output pin 225. The signal output by the first CAM device 220 is input to the next, a second, CAM device 220 in the cascaded CAM system 200. If the signal input to the second CAM device 220 indicates a match, i.e., that the first, higher CAM device 220 had a match, then the second CAM device 220 provides a signal to its match flag output pin 225 indicating a match. That signal is cascaded down to the remaining, lower priority, CAM devices 220, effectively preventing, or locking out, all the lower CAM devices 220.

A CAM device 220 acts according to the input received from match flag input pin 224. If the signal input on match flag input pin 224 to the second CAM device 220 does not indicate a match, i.e., that the first, higher CAM device 220 did not have a match, then the second CAM device 220 determines whether its CAM bank 130 has a match. If the match priority encoder 260 of the second CAM device 220 determines that a match occurred in its CAM bank 130, then the match priority encoder 260 of the second CAM device 220 provides a signal indicating a match to match flag output pin 225. If the match priority encoder 260 of the second CAM device 220 determines that no match occurred in its CAM bank 130, then the match priority encoder 260 of the second CAM device 220 provides a signal indicating no-match to match flag output pin 225. The lowest priority CAM device 220 in the cascade will only be able to determine if its associated CAM bank 130 has a match if no previous CAM devices 220 in the cascade have a match.

The highest priority CAM device 220 having a match provides its related data (e.g., address data, etc.) stored in register 270 to the common data output bus 265. The match priority encoder 260 of the highest priority CAM device 220 having a match provides a signal to its associated register 270 through line 264 which indicates that register 270 is permitted to provide its data on line 155. The remaining respective registers 270 of the other CAM devices 220 are not enabled to provide their respective address data to the common data output bus 265, therefore only a single CAM device 220 provides its data to the common data output bus 265. Although not shown, the cascaded CAM system 200 in FIG. 2 may also track whether multiple matches occur. Furthermore, address data provided to the common data output bus 265 may include other information in addition to the address data corresponding to the stored data that matched the comparand.

In the cascade CAM system 200, the lowest priority CAM device 220 must wait until the match flag signals from the previous CAM devices 220 have cascaded through each CAM device 220 in the cascaded chain before the global match flag 237 is generated. The time required to generate the global match flag 237, as well as the time required for the last CAM device 220 to resolve its match priority, is directly related to the number of cascaded devices 220. If the lowest priority CAM device 220 in the cascade has a match, it will be able to output its data to the common output bus 265 only if no other CAM devices 220 in the cascade, e.g., no previous, higher priority CAM devices 220, has a match. This may result in an undesirably long time to generate the system match flag 237 and for the last CAM device 220 to potentially output data to the common output bus 265 if the last CAM device 220 has a match, and no previous CAM device 220 has a match.

When a memory device (i.e., a memory circuit board) is manufactured which includes a cascaded CAM system 200 in a daisy chain, the CAM devices 220 are coordinated by programming each CAM device 220 with the same latency so that all of the CAM devices 220 run on the same clock cycle (or cycles). Since certain operations (e.g., reading, writing, or additional searching) cannot occur during the latency period, these operations are effectively held up on the cascaded CAM system 200 while awaiting results of the search from all of the CAM devices 220.

FIG. 4 shows another conventional approach to a cascaded CAM memory arrangement. The cascaded CAM system 400 of FIG. 4 attempts to decrease latency time in the system by providing the match flag signal of each CAM device 420 directly to all the other CAM devices 420 in the cascaded chain. As seen in FIG. 4, the match flag output signal that is carried on line 135 of each CAM device is coupled directly to the other CAM devices 220 in the cascade.

Turning now to FIG. 5, the CAM device 420 of FIG. 4 is shown in greater detail. The significant difference between CAM device 420 and CAM device 220 (of FIGS. 2 and 3) is the manner in which each CAM device determines priority. CAM device 420 includes a match priority encoder 460 which operates differently than the match priority encoder 260 of the CAM device 220 (FIG. 3). As described above, the CAM device 220 determines its match priority based on the input from the preceding CAM devices 220. However, each CAM device 420 receives match flag signal information directly from all other CAM devices 420 in the cascaded system (FIG. 4) and individually determines whether it is the highest priority CAM device 420 (described in greater detail below).

The priority encoder 150 is mutually coupled to and provides match flag signal information on line 131 to the match priority encoder 460 and provides the information to an output pin 225, which is coupled to line 135. Line 135 is mutually coupled to all other CAM devices 420 in the cascaded system 400 (FIG. 4). Although not shown, priority encoder 150 may be mutually coupled to and provide multi-match flag signal information to the match priority encoder 460 through an output pin.

CAM device 420 receives match flag signal information directly from all other CAM devices 420 through the input pin 224 and on line 262. The input from all other CAM devices 220 is hard wired; therefore, the match priority encoder 460 is able to identify which match flag signal corresponds to which CAM device 420. Each CAM device 420 is programmed with its priority relative to the other CAM devices 420. Therefore, a match priority encoder 460 in each CAM device 420 determines which, if any, match flag signals are received from higher priority CAM devices 420 and which, if any, match flag signals are received from lower priority CAM devices 420. Although not shown, multi-match flags may be similarly provided by each CAM device 420 to all the other respective CAM devices.

If a match priority encoder 460 has received a match flag signal from its priority encoder 150 and determines, based on the match flag signals received from the other CAM devices 420, that it is the highest priority CAM device 420 having a match, then the match priority encoder 460 provides a signal to the register 270. In response to the signal received from the priority encoder 460, register 270 provides address information that was stored in the register 270 to the common data output bus 265 through line 155 (FIGS. 4 and 5). As described above, register 270 may also provide higher order address bits.

CAM system 400 minimizes the latency associated with waiting for the match flag signal from respective CAM devices 420 to ripple through the cascaded chain, but increases the number of match flag input/output pins and associated circuitry required both within each and coupling each CAM device 420.

Therefore, there is a need for a CAM device that achieves a balance between the number of match flag input pins required per cascaded CAM system configuration and the latency time required to propagate match flag information to the other CAM devices of the cascaded CAM system. Preferably, the design of the CAM device would permit minimizing the number of pins required on the CAM device. Further, the design of the CAM device would minimize latency through a system of cascaded CAM devices.

The size of a cascaded CAM system, i.e., the number of CAM devices, suggests an appropriate CAM device to be used in the cascaded CAM system. As the size of the cascaded CAM system increases, the latency and/or the number of match flag input pins correspondingly increases. Thus, a CAM device chosen for use in a smaller-sized cascaded CAM system may be impractical or inefficient for use in a larger-sized cascaded CAM system.

Therefore, it is desirable to have a CAM device that would permit flexibility in the size of the cascaded CAM system without having to implement different CAM devices and that retains the number of match flag input pins and/or the speed of the smaller cascade system regardless of the number of cascaded CAM devices.

BRIEF SUMMARY OF THE INVENTION

The present invention addresses the above described needs and provides a CAM device for use in a cascaded CAM system. The CAM device may be used in various sized cascades and requires only minimal programming while minimizing the number of pins required for a given CAM device in a cascade. Further the cascade system may be relatively large and still retain the relative speed of a relatively small cascade system. In smaller cascades, the CAM device determines which of the CAM devices of the cascade system is the highest priority CAM device having a match, and also determines whether it is the highest priority CAM device having a match. In larger cascades, an external cascade device determines the highest priority CAM device having a match and provides that information to all of the CAM devices. The CAM device then determines whether it is the highest priority CAM device having a match.

The CAM device has a match priority encoder for determining whether it is the highest priority CAM device having a match, where the CAM device is adapted to provide to and receive match information from an external cascade device. The CAM device is also adapted to provide to and receive match information from another CAM device. After receiving the match information from either the external cascade device or another CAM device, depending on the implementation of the CAM device, the CAM device decides whether it is the highest priority CAM device having a match.

In another embodiment of the invention, a cascaded CAM system is provided that dynamically addresses CAM system latency. The CAM device determines the cascaded CAM system latency using invalid match/multi-match signal combinations along with a FIFO register. The validity of match/multi-match signals dynamically indicate to the CAM device the status of the system latency. When both the match and multi-match signals are valid, the CAM devices determines that a search operation is complete.

BRIEF DESCRIPTION OF THE DRAWINGS

These and other features and advantages of the invention will be more readily understood from the following detailed description of the invention which is provided in connection with the accompanying drawings, in which.

DETAILED DESCRIPTION OF THE INVENTION

In the following detailed description, reference is made to the accompanying drawings, which form a part hereof, and in which is shown by way of illustration specific embodiments in which the invention may be practiced. These embodiments are described in sufficient detail to enable those of ordinary skill in the art to make and use the invention, and it is to be understood that structural, logical, or procedural changes may be made to the specific embodiments disclosed without departing from the spirit and scope of the present invention.

Figure 1:
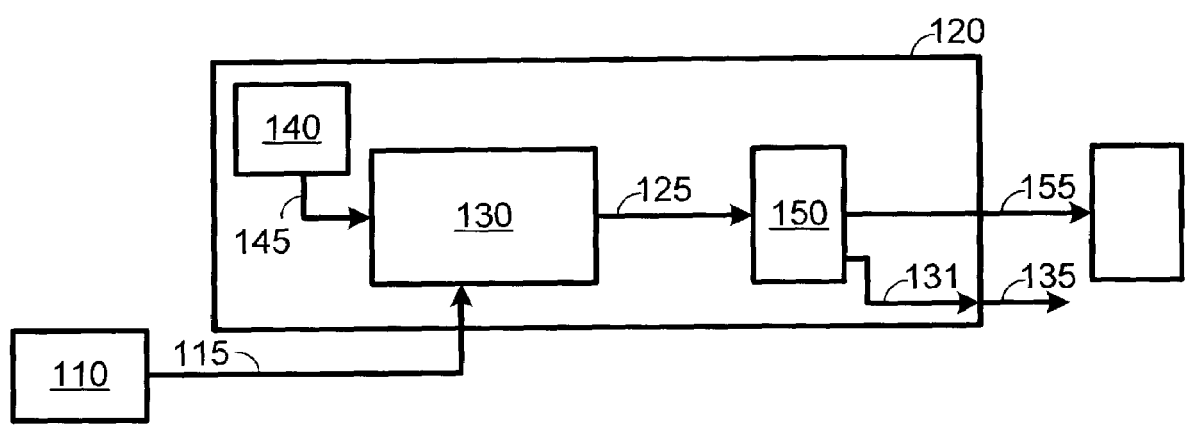
FIG. 1 is a block diagram of a conventional CAM device.
Figure 2:
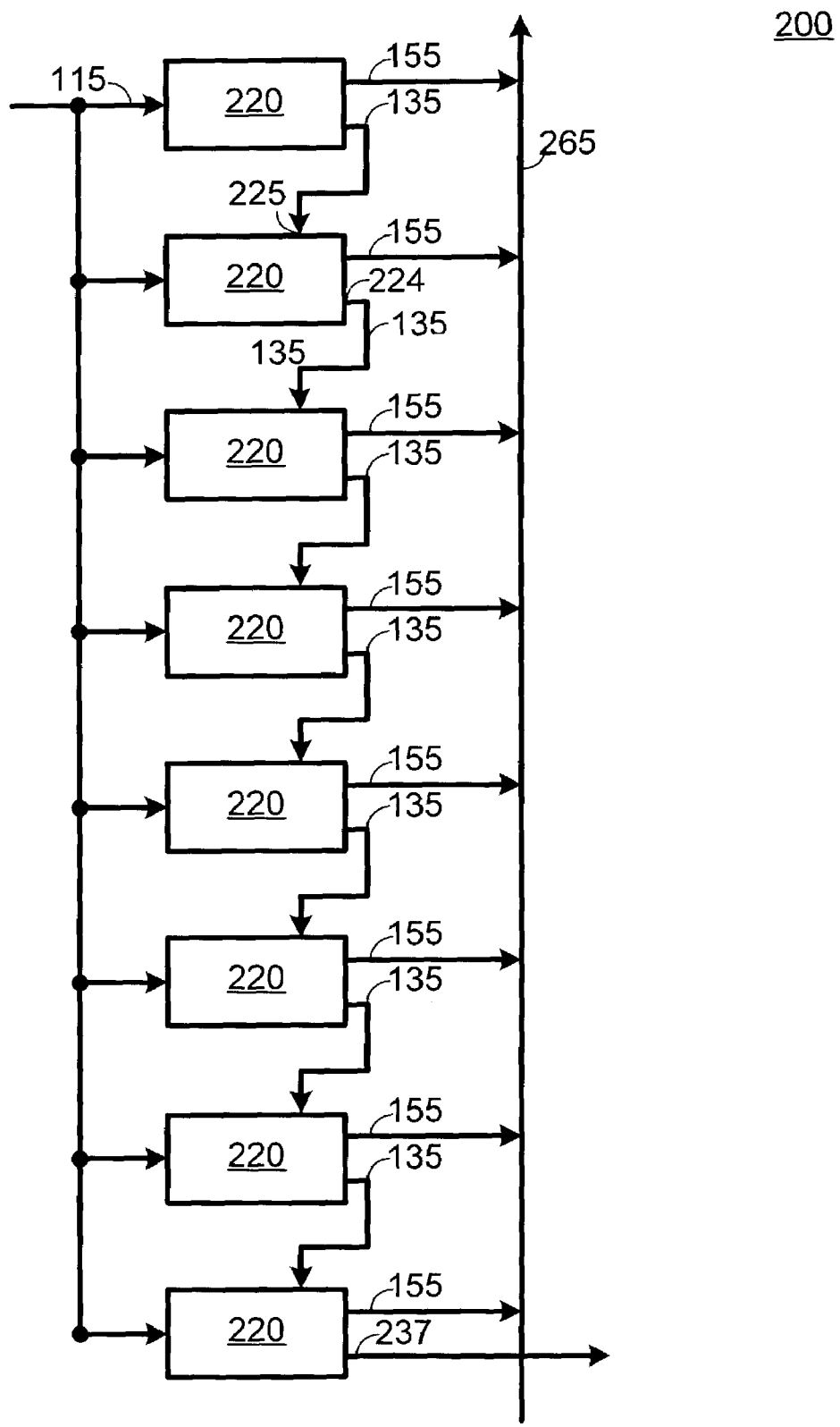
FIG. 2 is a block diagram of a conventional cascaded CAM system.
Figure 3:
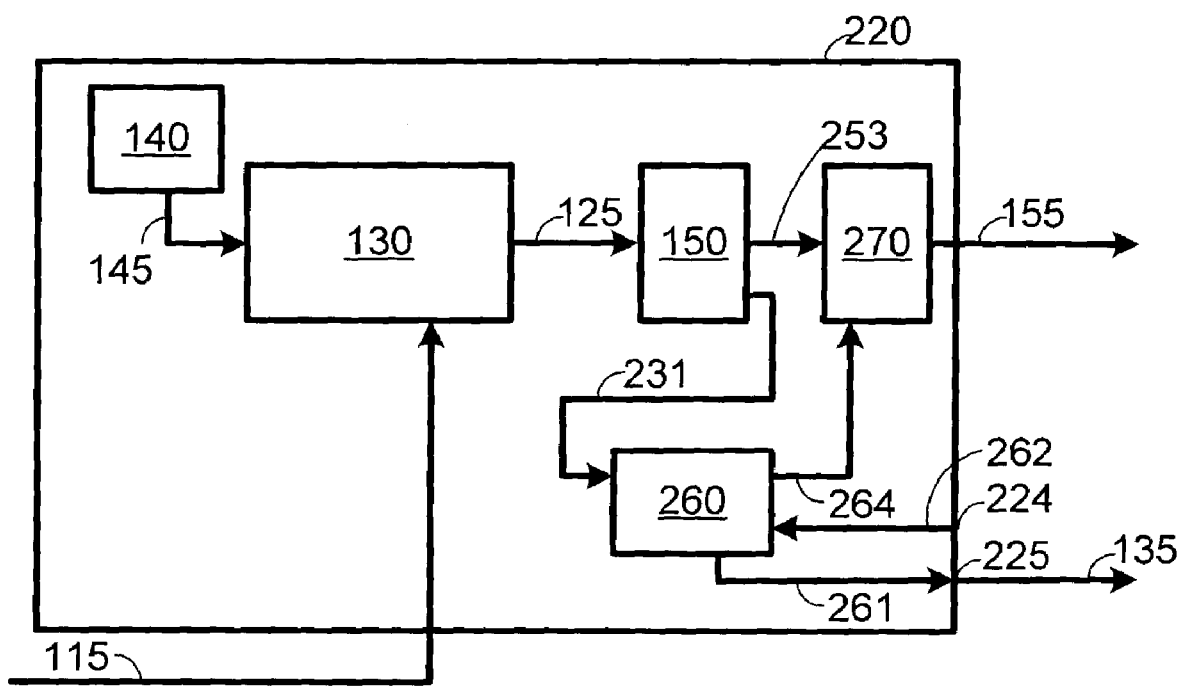
FIG. 3 is a block diagram of a conventional CAM device of the FIG. 2 cascaded CAM system.
Figure 4:
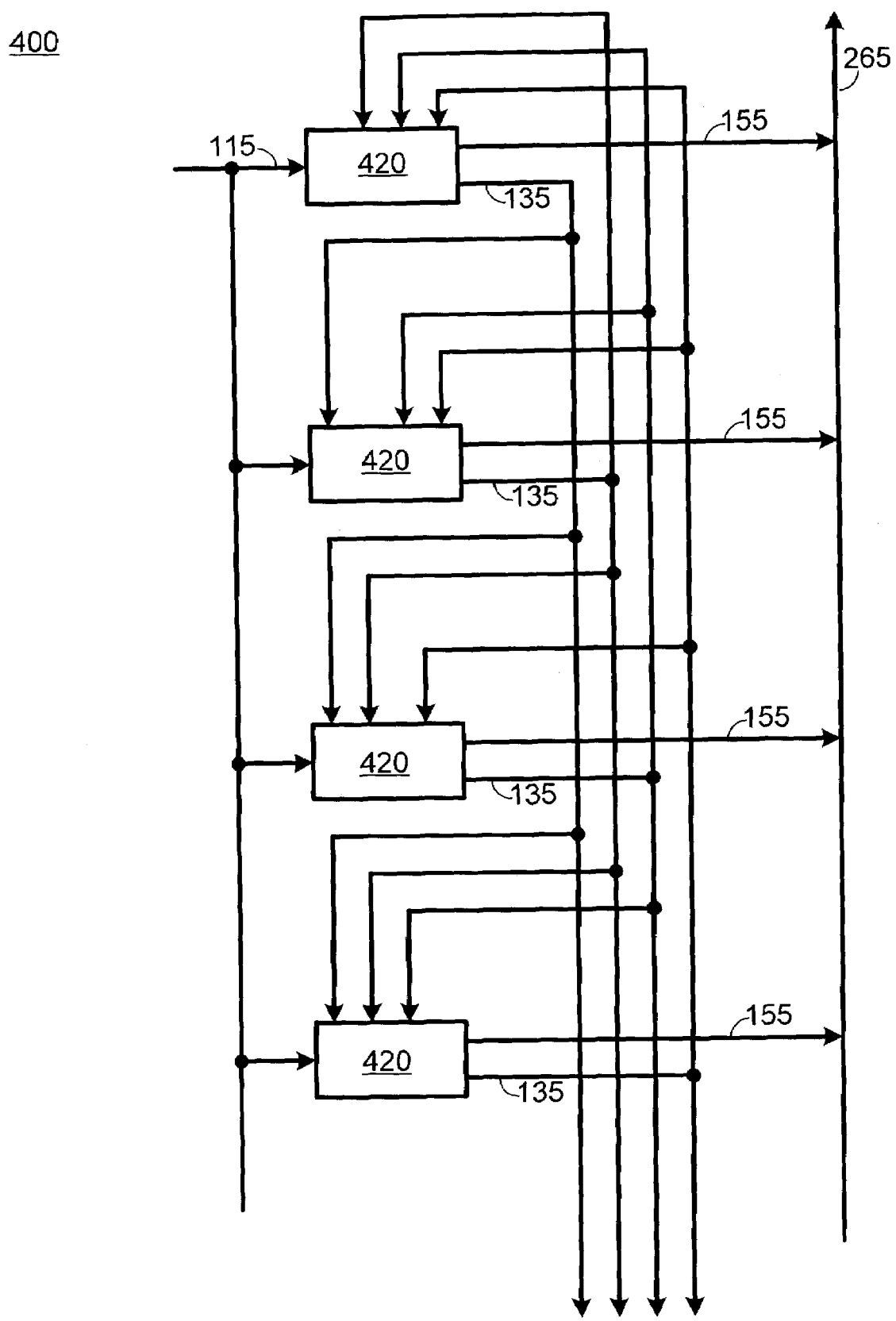
FIG. 4 is a block diagram of another conventional cascaded CAM system.
Figure 5:
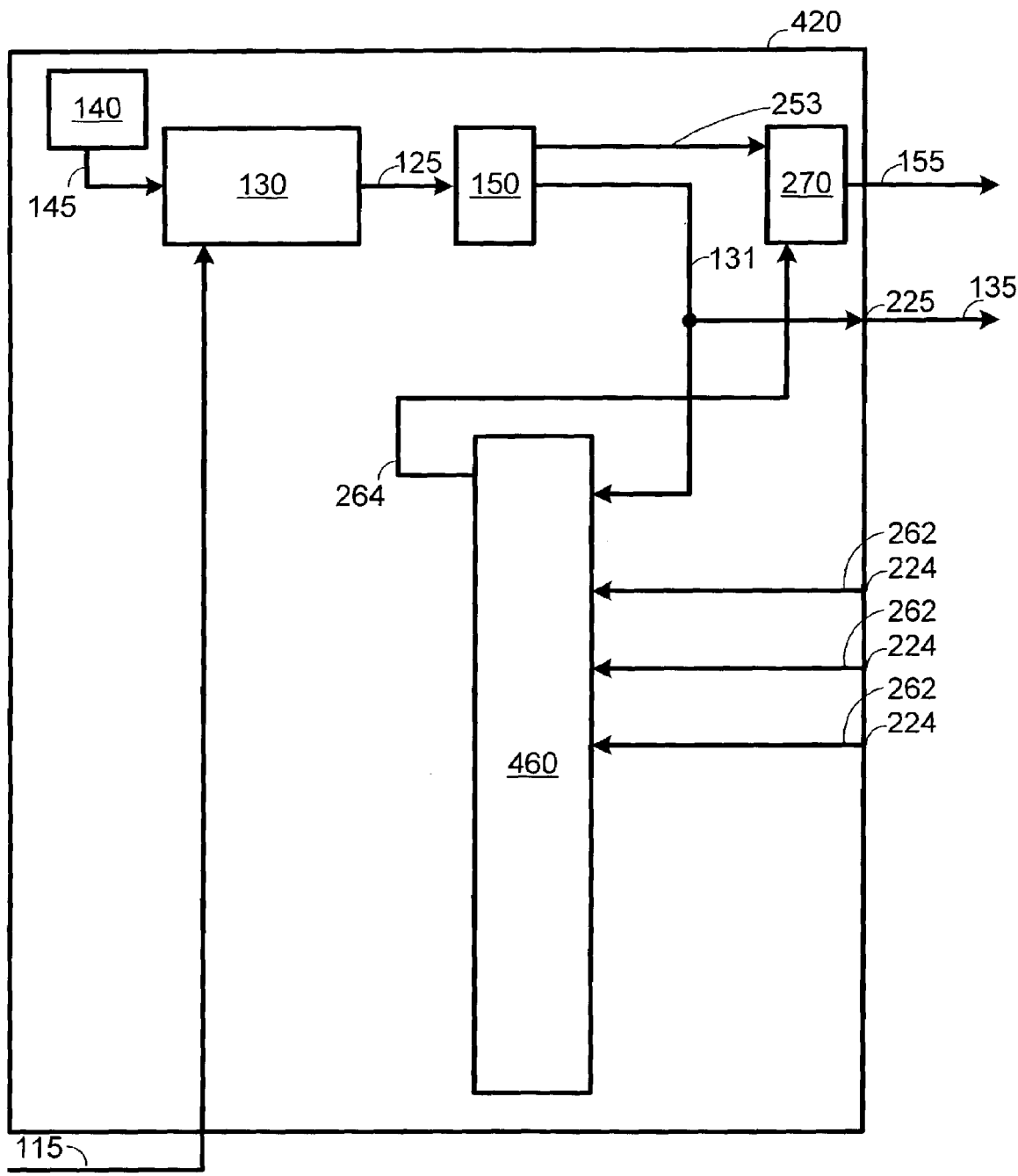
FIG. 5 is a block diagram of a CAM device of the FIG. 4 cascaded CAM system.
Figure 6:
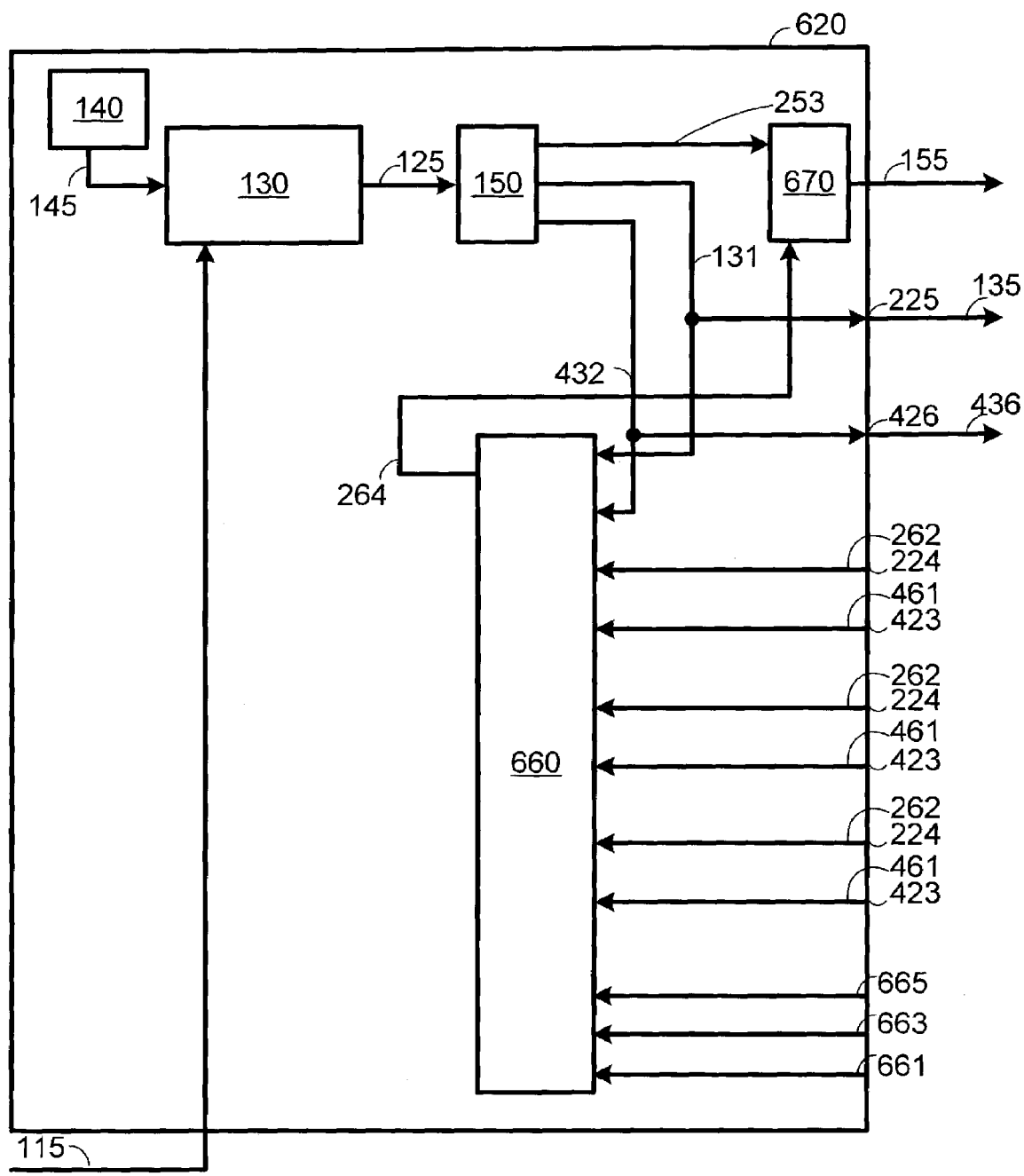
FIG. 6 is a block diagram of a CAM device in accordance with an exemplary embodiment of the invention.

FIG. 6 shows a block diagram of a CAM device 620 in accordance with an exemplary embodiment of the invention. CAM device 620 operates in two modes—an internally and an externally controlled cascaded system. Further, CAM device 620 is adapted to receive match information signals from two different sources, e.g., either other CAM devices 620 or an external logic device (described in greater detail below).

CAM device 620 also determines whether the CAM device 620 is the highest priority CAM device 620 having a match based on a two step process. In the first step, the global identification of the highest priority CAM device 620 having a match is determined. When the CAM device 620 operates in an external mode, an external device determines the global identification of the highest priority CAM device 620 having a match and transmits that information to the CAM device 620. When CAM device 620 operates in an internal mode, the CAM device 620 determines the global identification of the highest priority CAM device 620 having a match. In the second step of the process, the CAM device 620 compares the global identification of the CAM device 620 to the global identification of the highest priority CAM device 620 having a match provided by either the external device or the CAM device 620. The CAM device 620 only requires simple reprogramming to designate in which mode the CAM device will operate.

Further, register 670 stores information in a first-in, first-out (FIFO) basis. Therefore, the results of a search are stored until they are needed. If a first search is completed and the resulting information is stored in the register 670, the CAM device 620 may conduct additional searches and store the results of those searches without affecting the first stored search. When register 670 receives a signal indicating that its CAM device 620 is the highest priority CAM device having a match on line 264, then the register 670 provides its first stored information on line 155. When register 670 receives a signal indicating that its CAM device 620 is not the highest priority CAM device having a match on line 264, then the first stored information in register 670 is discarded.

The priority encoder 150 outputs through line 432 to an output pin 426 and then through line 436 a signal, e.g., a multi-match signal, indicating whether a match detection circuit within the CAM bank 130 found more than one match between comparand data and stored data. The priority encoder 150 is also coupled to the match priority encoder 660 through line 432, thereby providing multi-match signal information to its match priority encoder 660.

A cascaded CAM system has inherent delays that must be accounted for in the implementation of the circuitry of the system. These delays include, for example, the time to load the CAM banks with data, time to load the comparand data into each CAM device, and the time for each CAM device in the CAM system to compare the comparand data to its stored bits. In a conventional cascaded CAM system, each CAM device is pre-programmed with a designed latency delay. The CAM device 620 may operate without pre-programming the latency into the CAM device 620 in a manner described in greater detail below.

Each CAM device 620 is programmed to have a unique identifying number. In a preferred embodiment in a system with N CAM devices 620, the highest priority CAM device 620 has an identifying number equivalent to zero, the lowest priority CAM device 620 has an identifying number equivalent to N−1, and the CAM devices 620 in between are numbered sequentially from zero corresponding to its priority. The identifying number of a CAM device 620 is used by the match priority encoder 660 to determine if the CAM device 620 is the highest priority CAM device having a match.

When the CAM device 620 operates in an internal mode, the CAM device 620 is adapted to receive signals provided by all other CAM devices 620 on lines 262, 461. The two lines 262, 461 are representative of each set of signals (e.g., match flag and multi-match) that are provided by the other CAM devices 620. In an internally controlled cascaded system, each CAM device 620 determines the highest priority CAM device 620 of a cascaded system that has a match, although CAM device 620 makes this determination in a different way than CAM device 420. An internally controlled cascaded system generally has eight, or fewer, CAM devices 620.

In an externally controlled cascaded system, an external cascade device determines the highest priority CAM device 620 that has a match and provides that information to each CAM device 620. An externally controlled cascaded system generally has more than eight CAM devices 620 and, in a preferred embodiment, can have up to 256 CAM devices 620. Match priority encoder 660 is adapted to receive signals provided by the external cascade device on lines 661, 663, 665.

Figure 7:
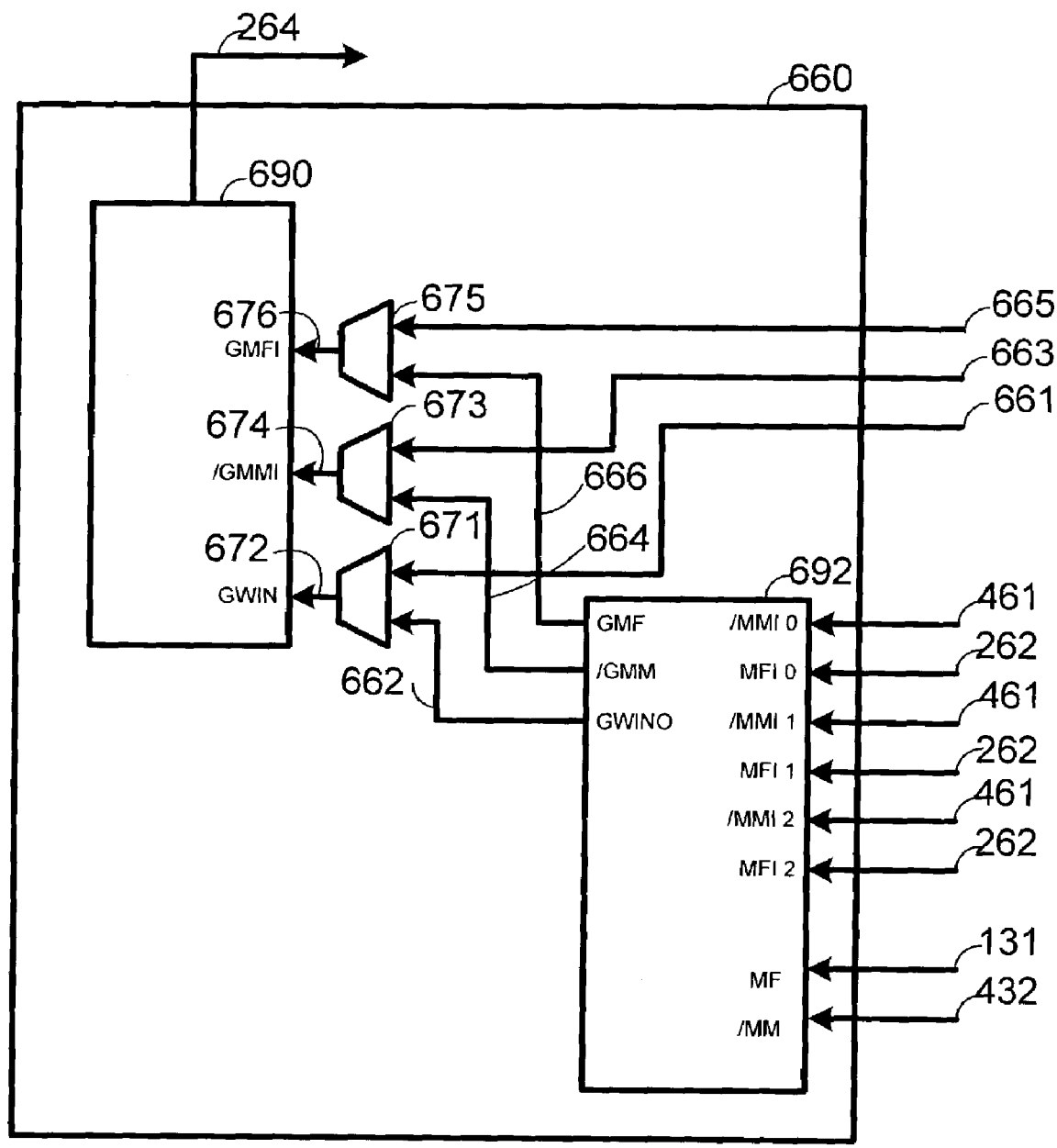
FIG. 7 shows a portion of the CAM device of FIG. 6 in greater detail.

The match priority encoder 660 of CAM device 620 is shown in greater detail in FIG. 7. The match priority encoder 660 includes first and second stage priority circuits 692, 690 and multiplexers 671, 673, 675. When the CAM device 620 is programmed for an internally controlled cascaded system, first stage circuit 692 determines the highest priority CAM device 620 having a match. When operating in the internally controlled cascaded system the multiplexers 671, 673, 675 are programmed to couple lines 662, 664, 666 to respective lines 672, 674, 676. Similar to the operation of match priority encoder 460, the first stage circuit 692 is hard wired to all other CAM devices 620 and associates incoming signals with their corresponding CAM device 620. The first stage circuit 692 receives match flag and multi-match signals from its priority encoder 150 on respective lines 131, 432. The first stage circuit 692 determines the highest priority CAM device 620 having a match and also determines the global identification number associated with the highest priority CAM device 620 having a match. The first stage circuit 692 determines the global match flag signal and global multi-match signals by comparing the match flag signals and multi-match signals from its CAM bank 130 to the match flag signal and multi-match signals received from all other CAM devices 620. The first stage circuit 692 provides global match flag, global multi-match, and global identification signals on respective lines 666, 664, 662, which are coupled to second stage priority circuit 690.

When the CAM device 620 is programmed for an externally controlled cascaded system, an external cascade device determines the highest priority CAM device 620 having a match. When operating in the externally controlled cascaded system the multiplexers 671, 673, 675 are programmed to couple lines 661, 663, 665 to respective lines 672, 674, 676. The external cascade device provides a global match flag signal, a global multi-match signal, and a global identification signal (indicating which CAM device with a match has the highest priority) on respective lines 665, 663, 661 which are coupled to second stage priority circuit 690 via multiplexers 675, 673, 671. Thus, when a CAM device 620 operates in an externally controlled cascaded mode, the external cascade device does the prioritization in the place of the first stage priority circuit 692, and the first stage priority circuit 692 is not utilized. The operation of the external cascade device is described more fully below.

In an internally controlled cascaded system 800 (of FIG. 8), respective output lines 135, 436 from each CAM 620 are directly coupled to input lines 262, 461 of the other CAM devices 620. For exemplary purposes in FIG. 7, it is depicted that the first stage priority circuit 692 respectively receives input from three other CAM devices 620; thus, there are three sets of input lines 262, 461. While only three CAM devices 620 are depicted, it should be readily apparent that any number of CAM devices 620 may be employed. The first stage priority circuit 692 receives match flag signals and multiple match signals from each of the other CAM devices 620 on lines 262, 461. In a preferred embodiment each match flag signal and multi-match signal is received on a separate line, therefore, each match flag signal and multi-match signal corresponds to a particular CAM device 620.

The second stage priority encoder 690 determines whether its associated CAM device 620 is the highest priority CAM device 620 having a match in both the internally and externally controlled cascaded modes. The second stage priority encoder 690 receives global match flag, global multi-match, and global identification signals from either first stage priority encoder 692 or an external logic device, depending on the programmed mode. The second stage priority encoder 690 compares the global identification signal received to its unique identifying number. If the global identification signal and its identifying number are equivalent, the CAM device 620 is the highest priority CAM device 620 having a match. Then match priority encoder 660 provides a logic signal to register 670 on line 264 indicating a match. If CAM device 620 is not the highest priority CAM device 620 having a match, then match priority encoder 660 does not provide a logic signal to register 670 on line 264. In another aspect, if CAM device 620 is not the highest priority CAM device 620 having a match, then match priority encoder 660 provides a negated logic signal (i.e., NOT logic) to register 670 on line 264.

Figure 8:
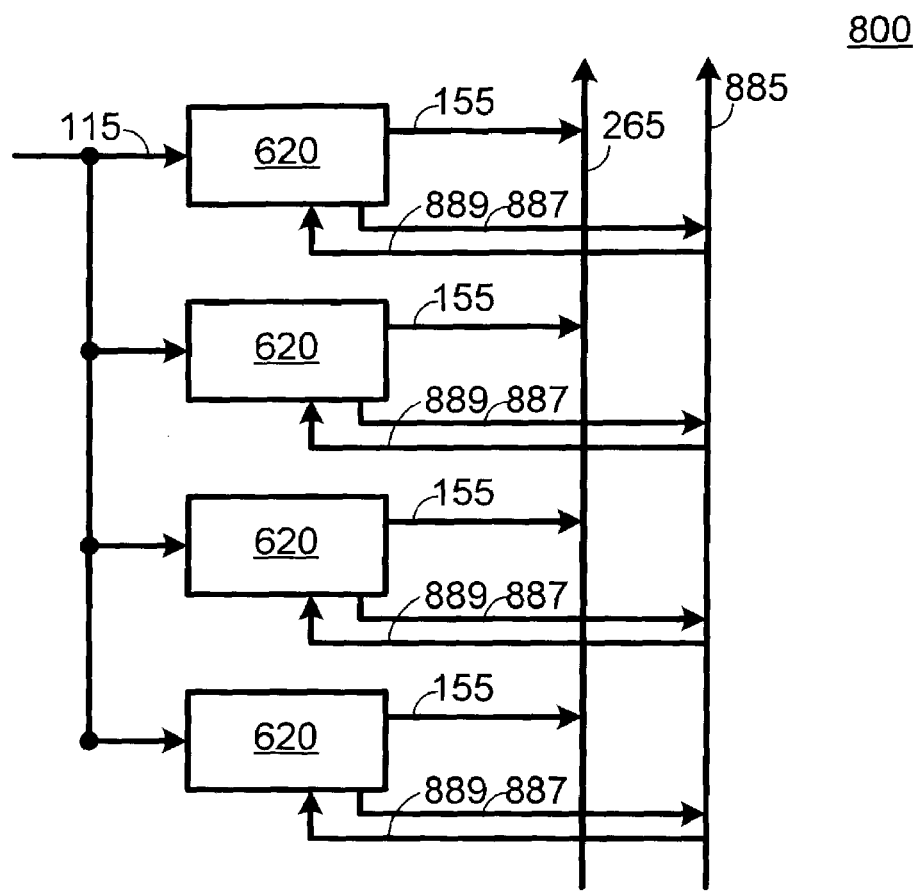
FIG. 8 is a block diagram of a cascaded CAM system employing the CAM device of FIG. 6.

FIG. 8 is a block diagram of a cascaded CAM system 800 employing the CAM device 620 of FIG. 6. FIG. 8 is an internally controlled cascaded CAM system 800 that has four cascaded CAM devices 620. Line 115 is mutually coupled to each CAM device 620 and provides the comparand data to each CAM device 620. Each CAM device 620 is also coupled to a common data output bus 265 through a respective line 155.

The match flag signal and multi-match signal from each respective CAM device 620 is coupled to all other CAM devices 620 in the cascaded system 800. Line 887 represents the match flag signal and multi-match signal information provided by each CAM device 620, e.g., lines 135, 436 (FIG. 6). Line 889 represents the match flag signal and multi-match signal information provided to each CAM device 620, e.g., lines 262, 461 (FIG. 6). Line 885, also referred to as a cascade bus, represents the collective lines coupling lines 887 and 889 to provide coupling between the cascaded CAM devices 620. Although shown as a single line for simplicity, lines 885, 887, 889 represent a plurality of lines.

Figure 9:
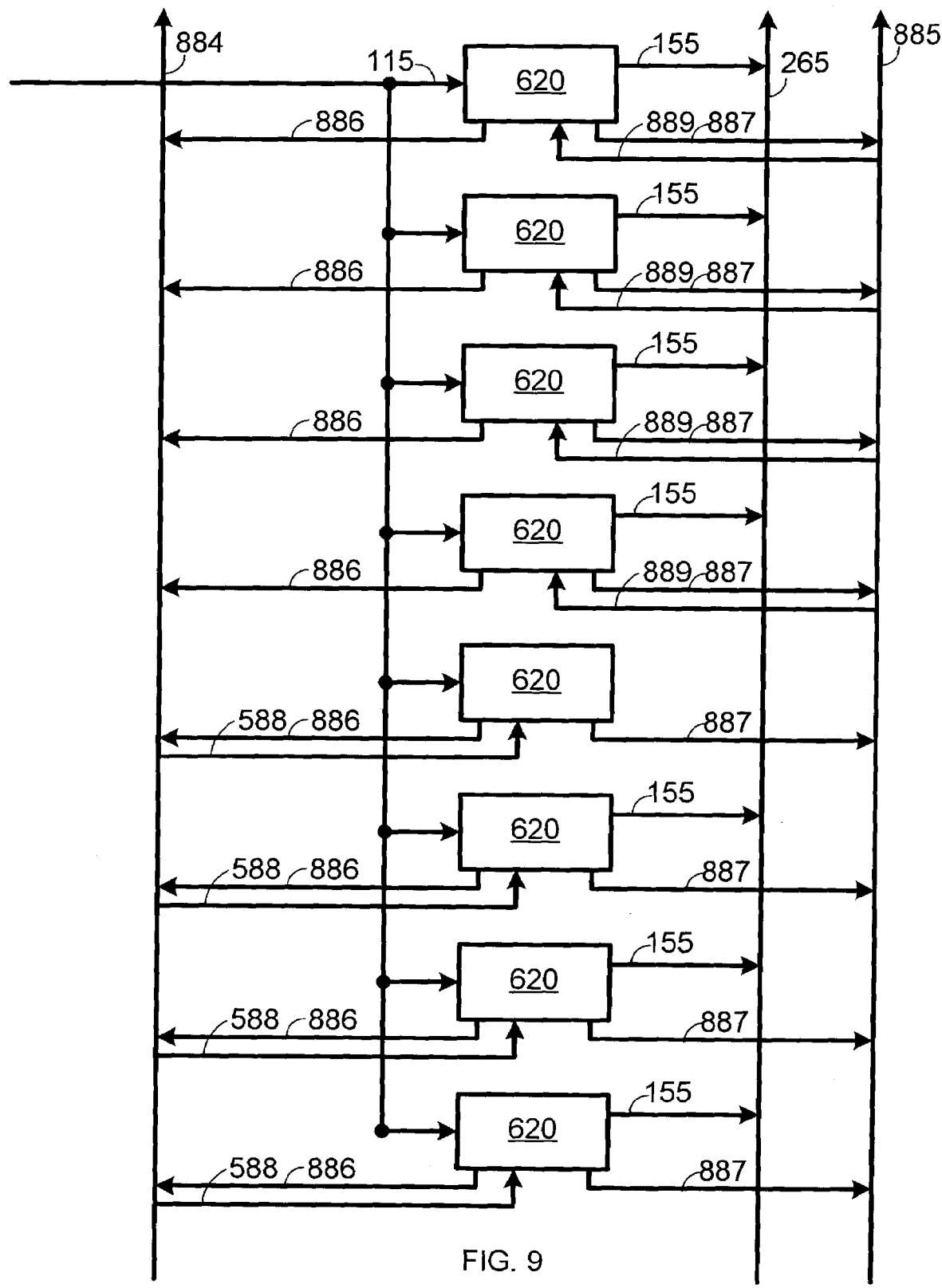
FIG. 9 is a block diagram of another cascaded CAM system employing the CAM device of FIG. 6.

Another aspect of the present invention is shown in FIG. 9, where an internally controlled cascaded CAM system 900 has eight cascaded CAM devices 620. In an exemplary embodiment, a second cascade bus 884 is included to share the signal transmission functions and to minimize the current drawn on the cascade bus 885. Each CAM device 620 provides a match flag signal and a multi-match signal to both cascade buses 884, 885 and each CAM device 620 receives a match flag signal and a multi-match signal from each of the other CAM devices 620. However, each cascade bus 884, 885 provides information only to a respective four CAM devices 620.

For example, as depicted in FIG. 9, cascade bus 885 provides information to the first (top) four CAM devices 620 and cascade bus 884 provides information to the second (bottom) four CAM devices 620. Otherwise, the operation of the CAM system 900 is identical to the operation of CAM system 800 (FIG. 7).

Figure 10:
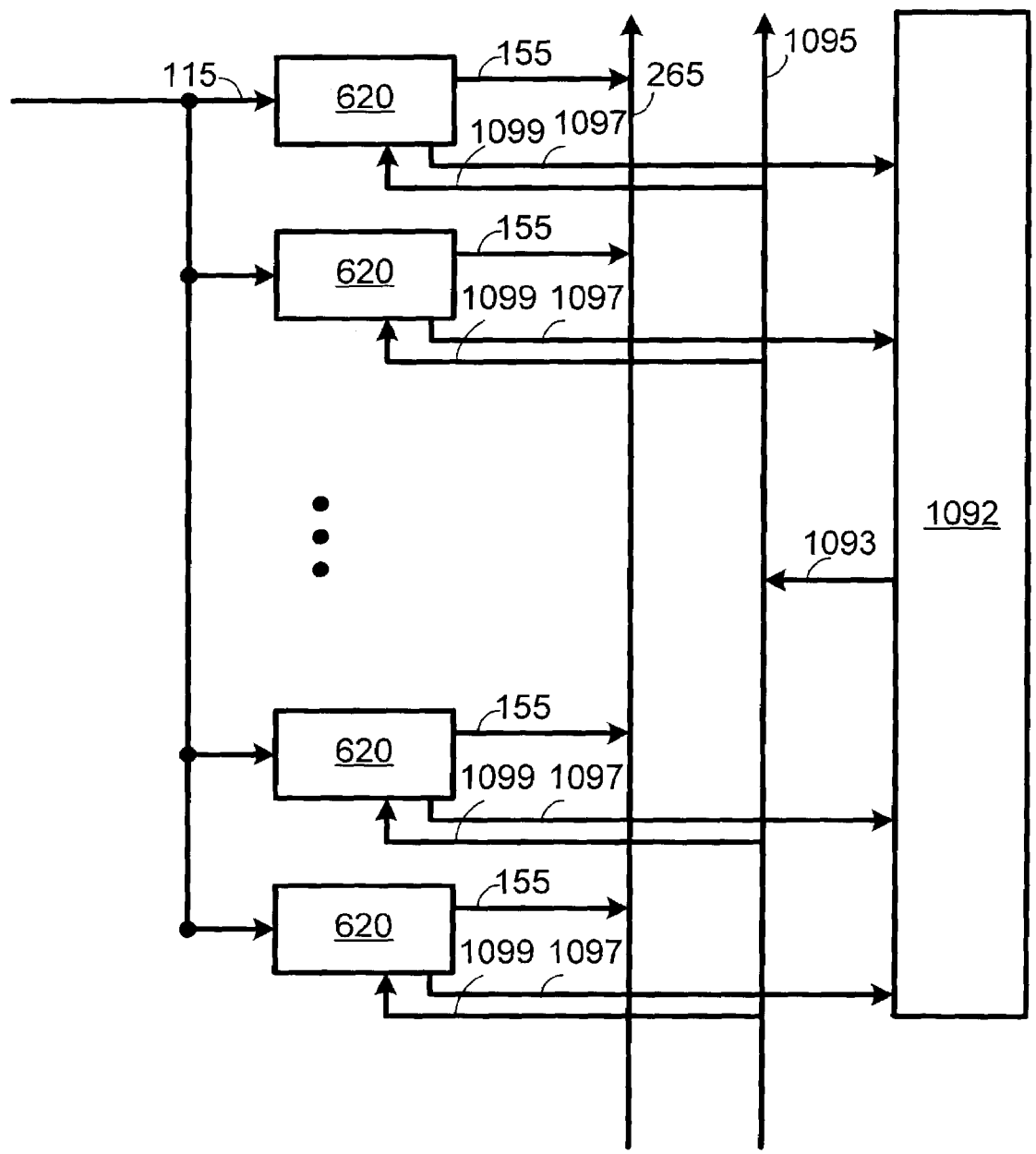
FIG. 10 is a block diagram of yet another cascaded CAM system employing the CAM device of FIG. 6.

FIG. 10 shows another aspect of the present invention where the cascaded CAM system 1000 is an externally controlled cascaded system. In an externally controlled cascaded system, an external cascade device 1092, rather than the first stage circuit 692 of each CAM device 620, determines which CAM device 620 with a match has the highest priority. As indicated above, match priority encoder 660 is programmed to indicate whether it is being employed in an internally or an externally controlled cascaded system. Thus in this aspect, the match priority encoder 660 is programmed for an externally controlled cascaded system.

The match information from each CAM device 620 provided by lines 135, 436 (FIG. 6), represented by line 1097 in FIG. 10, are directly coupled to the external cascade device 1092. External cascade device 1092 receives a match flag signal and a multi-match signal from each of the CAM devices 620. The external cascade device 1092 is directly coupled to each CAM device 620, and the external cascade logic device 1092 determines the association between the match flag signals and the multi-match signals and the CAM devices 620 as well as the associated global identification of the CAM devices.

External cascade device 1092 determines and provides a global match flag signal, a global multi-match signal, and a global identification signal for the system 1000 on line 1093 to a cascade bus 1095. The cascade bus 1095 provides the global match flag signal, global multi-match signal, and global identification signals to each CAM device 620 through a respective line 1099. Although shown as one line for simplicity, line 1099 represents lines 661, 663, 665 (FIGS. 6, 7).

Figure 11:
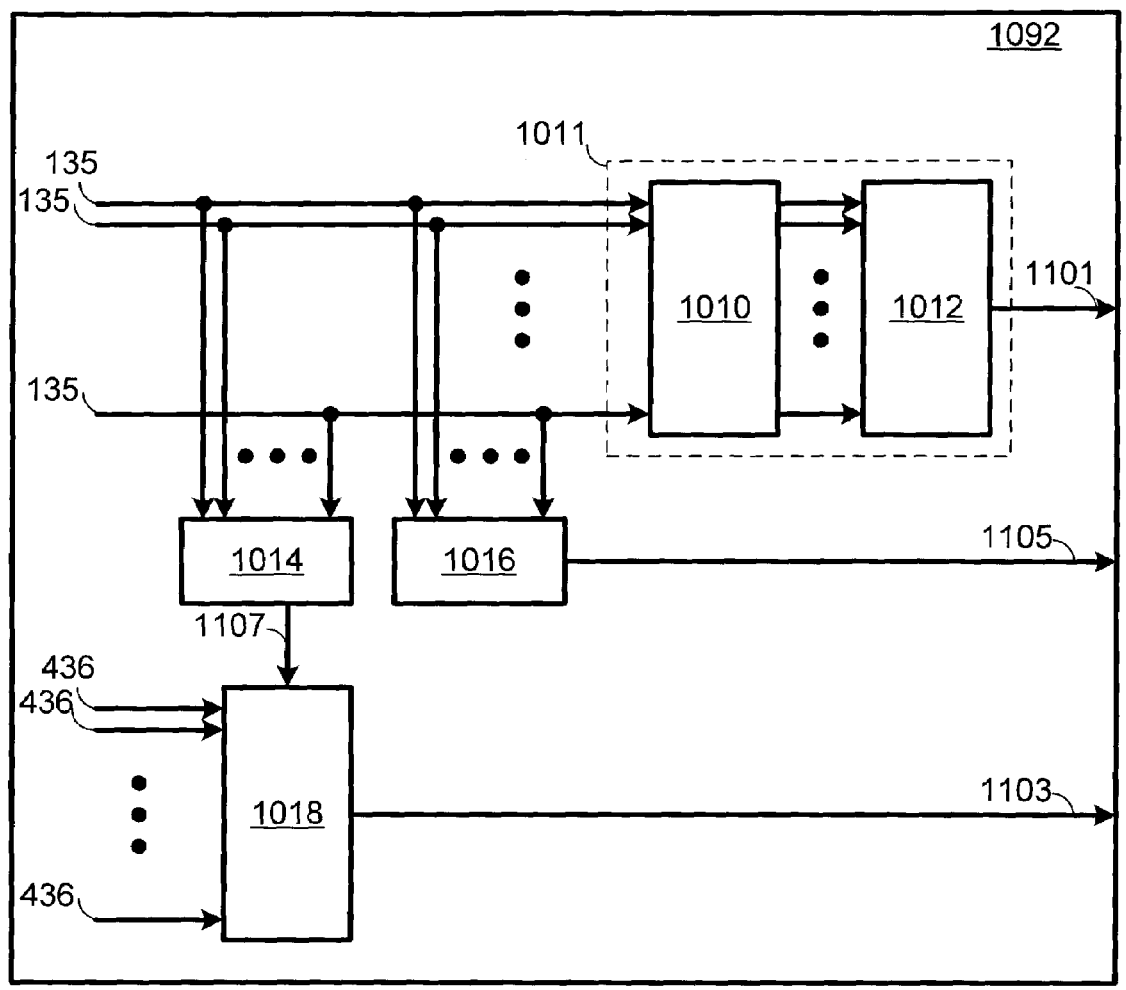
FIG. 11 shows a portion of the cascaded CAM system of FIG. 10 in greater detail.

In this aspect of the invention, an external cascade device 1092, which is external to the CAM devices 620, determines the highest priority CAM device 620. Thus, the external cascade device 1092 of FIG. 10 performs similarly to, and instead of, the first stage priority circuit 692 of FIG. 7. The external cascade device 1092 is shown in greater detail in FIG. 11. A match flag signal is received from each CAM device 620 on a respective line 135. A multi-match flag signal is received from each CAM device 620 on a respective line 436. Lines 135 are mutually coupled to priority encoder 1010 and circuits 1014, 1016.

Global identification circuit 1011 determines the global identification of the CAM device 620 with a match which has the highest priority and includes priority encoder 1010 and address encoder 1012. Priority encoder 1010 determines which CAM device 620 with a match has the highest priority by looking at which line 135 from respective CAM devices 620 has the highest priority. Priority encoder 1010 provides the information indicating which line is the highest priority to the address encoder 1012, which determines the corresponding global identification of the highest priority CAM device 620, e.g., the unique identifying number, of the CAM device 620. The address encoder 1012 provides the global identification signal on line 1101.

Global multi-match circuit 1018, in conjunction with cumulative multi-match circuit 1014 operates as a multi-match detector. Cumulative multi-match circuit 1014 receives input from all of lines 135. If more than one line 135 has a signal indicating a match, then cumulative multi-match circuit 1014 provides a signal indicating a multi-match to global multi-match circuit 1018 on line 1107. Circuit 1018 receives input from lines 436. If any one of the lines 436 has a signal indicating a multi-match or line 1107 from cumulative multi-match circuit 1014 indicates a multi-match, then global multi-match circuit 1018 provides a signal, e.g., a global multi-match signal, on line 1103.

Global match flag circuit 1016 is a global match flag detector. Global match flag circuit 1016 receives input from lines 135. If any one of lines 135 has a signal indicating a match, then global match flag circuit 1016 provides a signal indicating a match on line 1105.

The global identification signal, the global match flag signal, and the global multi-match signal are respectively provided to the cascade bus 1095 (FIG. 10) on lines 1101, 1105, 1103 (FIG. 11) (which are represented by line 1093 in FIG. 10), which, in turn, are provided to each CAM device 620. Each match priority encoder 660 (FIG. 6) of each CAM device 620 receives the global match flag signal, the global multi-match signal, and the global identification signal on lines 665, 663, and 661, respectively (FIGS. 6, 7).

Since each CAM device 620 is in an externally controlled cascaded system, second stage priority circuit 690 is coupled to receive data on lines 661, 663, and 665 and without going through first stage priority circuit 692. Similar to the operation in the previous aspect, the second stage priority circuit 690 determines whether the CAM device 620 is the highest priority CAM device 620 having a match. CAM device 620 is the highest priority CAM device 620 having a match if the identifying number provided on line 672 (FIG. 7) is substantially equivalent to the identifying number of the CAM device 620. If CAM device 620 is the highest priority CAM device 620 having a match then second stage priority circuit 690 provides an appropriate signal on line 264 to the register 670 (FIGS. 6, 7). In the externally controlled cascaded circuit 1000 of FIG. 10 up to sixty-four CAM devices 620 can be cascaded.

Consequently, a CAM device 620 is provided that can be used for various sizes of CAM cascades. The use of an externally controlled cascaded system requires only minimal circuitry, e.g., the external cascade device 1092, in addition to the circuitry required for the internally controlled cascaded system. Using a CAM device's internal first stage priority encoder 692 permits a relatively quick search to be performed. Additionally, the use of external cascade device 1092 enables a greater number of CAM devices 620 to be cascaded without significantly increasing the time to perform a search.

Figure 12:
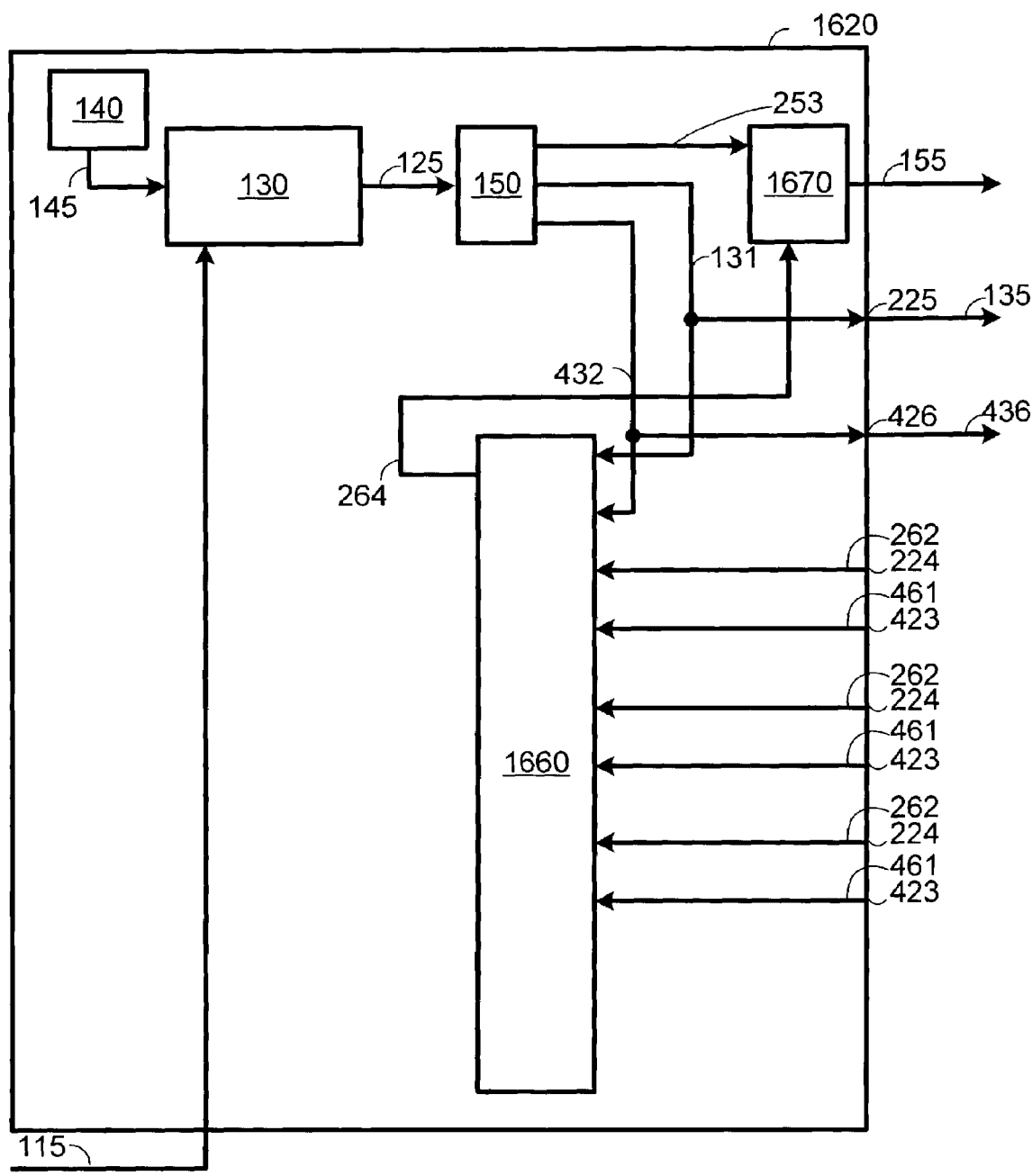
FIG. 12 is a block diagram of a CAM device in accordance with another exemplary embodiment of the invention.

FIG. 12 shows a block diagram of a CAM device 1620 in accordance with an exemplary embodiment of the invention. Match priority encoder 1660 is a dynamic latency device and is designed to respond at non-fixed latency times rather than a fixed latency time. In a conventional cascaded CAM system, the CAM devices in the system are programmed with a certain predetermined delay before the CAM device is permitted to provide a response to the search request. The latency is intended to not only address inherent system delays, but also facilitate coordination between cascaded CAM devices. The match priority encoder 1660 takes advantage of the match flag signal and multi-match flag signals provided on each of two lines, e.g., respective lines 262, 461, to enable a variable latency period. Since there are two lines, each line having two possible states, there are four possible conditions that can occur from these signals: no match and no multi-match, match and no multi-match, match and multi-match, and a nonsense state (i.e., no match and multi-match). By monitoring the inputs and discerning a valid state from an invalid state, e.g., a "handshaking" signal, latency for the system becomes dynamic and depends on each execution of a search. Additionally, other CAM operations can occur while awaiting the other CAM devices to complete their search.

If the CAM device monitors the match and multi-match inputs and determines that one of the three valid states occurs, then it will permit data from the register to be output. If the fourth state, e.g., the nonsense state, is received, then the register 1670 is not enabled and does not provide any data on line 155. In addition, by using a FIFO register a CAM device can store results of a search and perform subsequent searches while waiting for the coordinated response of the other CAM devices. Although described in reference to a particular CAM system, the dynamic latency CAM device 1600 may be implemented in any cascaded CAM system, including that cascaded CAM system described above with reference to FIGS. 6-11.

Figure 13:
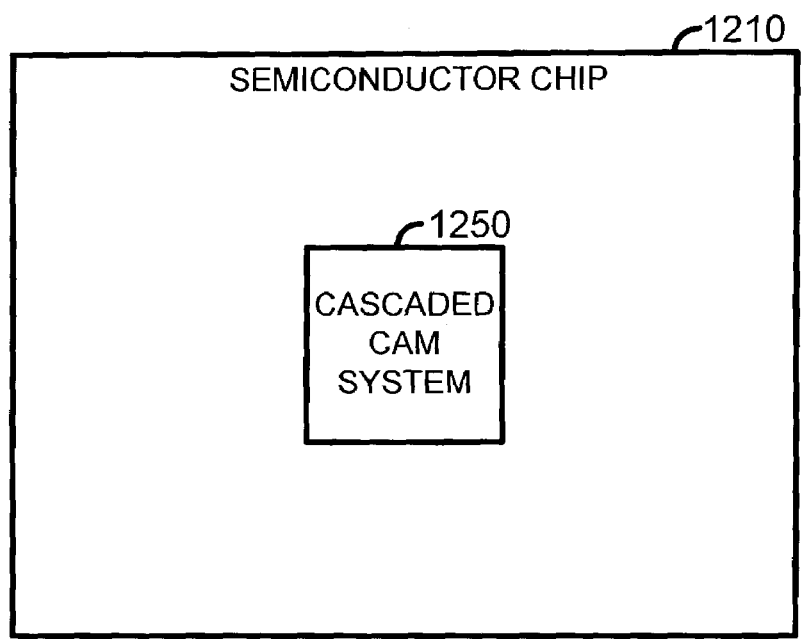
FIG. 13 shows a cascaded CAM system of the invention on a semiconductor chip.

FIG. 13 depicts a cascaded CAM system 1250, such as that described in connection with FIGS. 6-12, included on a semiconductor memory chip 1210 so that it may be incorporated into a router or other processor system.

Figure 14:
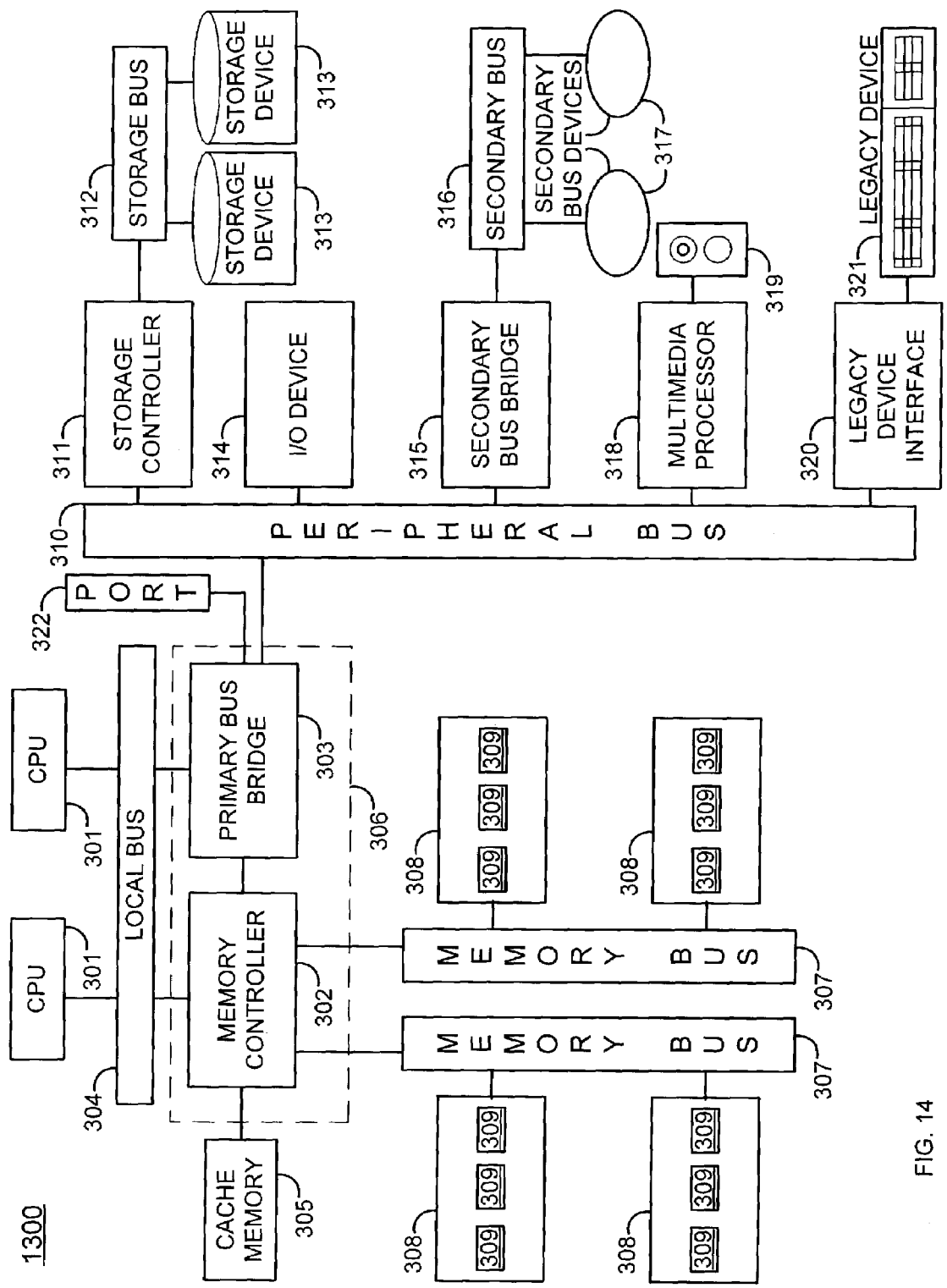
FIG. 14 is a schematic diagram of a processor system employing the CAM device of FIG. 6 or 12 as part of a cascaded CAM system, in accordance with another exemplary embodiment of the invention.

FIG. 14 illustrates an exemplary processing system 1300 which employs the cascaded CAM system 1250 of FIG. 13. The processing system 1300 includes one or more processors 301 coupled to a local bus 304. A memory controller 302 and a primary bus bridge 303 are also coupled the local bus 304. The processing system 1300 may include multiple memory controllers 302 and/or multiple primary bus bridges 303. The memory controller 302 and the primary bus bridge 303 may be integrated as a single device 306.

The memory controller 302 is also coupled to one or more memory buses 307. Each memory bus accepts memory components 308. Any one of memory components 308 may contain a cascaded CAM system 1250 such as that described in connection with FIG. 13.

The memory components 308 may be a memory card or a memory module. The memory components 308 may include one or more additional devices 309. For example, in a SIMM or DIMM, the additional device 309 might be a configuration memory, such as a serial presence detect (SPD) memory. The memory controller 302 may also be coupled to a cache memory 305. The cache memory 305 may be the only cache memory in the processing system. Alternatively, other devices, for example, processors 301 may also include cache memories, which may form a cache hierarchy with cache memory 305. If the processing system 1300 include peripherals or controllers which are bus masters or which support direct memory access (DMA), the memory controller 302 may implement a cache coherency protocol. If the memory controller 302 is coupled to a plurality of memory buses 307, each memory bus 307 may be operated in parallel, or different address ranges may be mapped to different memory buses 307.

The primary bus bridge 303 is coupled to at least one peripheral bus 310. Various devices, such as peripherals or additional bus bridges may be coupled to the peripheral bus 310. These devices may include a storage controller 311, a miscellaneous I/O device 314, a secondary bus bridge 315, a multimedia processor 318, and a legacy device interface 320. The primary bus bridge 303 may also be coupled to one or more special purpose high speed ports 322. In a personal computer, for example, the special purpose port might be the Accelerated Graphics Port (AGP), used to couple a high performance video card to the processing system 1300.

The storage controller 311 couples one or more storage devices 313, via a storage bus 312, to the peripheral bus 310. For example, the storage controller 311 may be a SCSI controller and storage devices 313 may be SCSI discs. The I/O device 314 may be any sort of peripheral. For example, the I/O device 314 may be a local area network interface, such as an Ethernet card. The secondary bus bridge may be used to interface additional devices via another bus to the processing system. For example, the secondary bus bridge may be a universal serial port (USB) controller used to couple USB devices 317 via to the processing system 1300. The multimedia processor 318 may be a sound card, a video capture card, or any other type of media interface, which may also be coupled to additional devices such as speakers 319. The legacy device interface 320 is used to couple legacy devices, for example, older styled keyboards and mice, to the processing system 1300.

The processing system 1300 illustrated in FIG. 14 is only an exemplary processing system with which the invention may be used. While FIG. 14 illustrates a processing architecture especially suitable for a general purpose computer, such as a personal computer or a workstation, it should be recognized that well known modifications can be made to configure the processing system 1300 to become more suitable for use in a variety of applications. For example, many electronic devices which require processing may be implemented using a simpler architecture which relies on a CPU 301 coupled to memory components 308 and/or memory devices 309. The modifications may include, for example, elimination of unnecessary components, addition of specialized devices or circuits, and/or integration of a plurality of devices.

Figure 15:
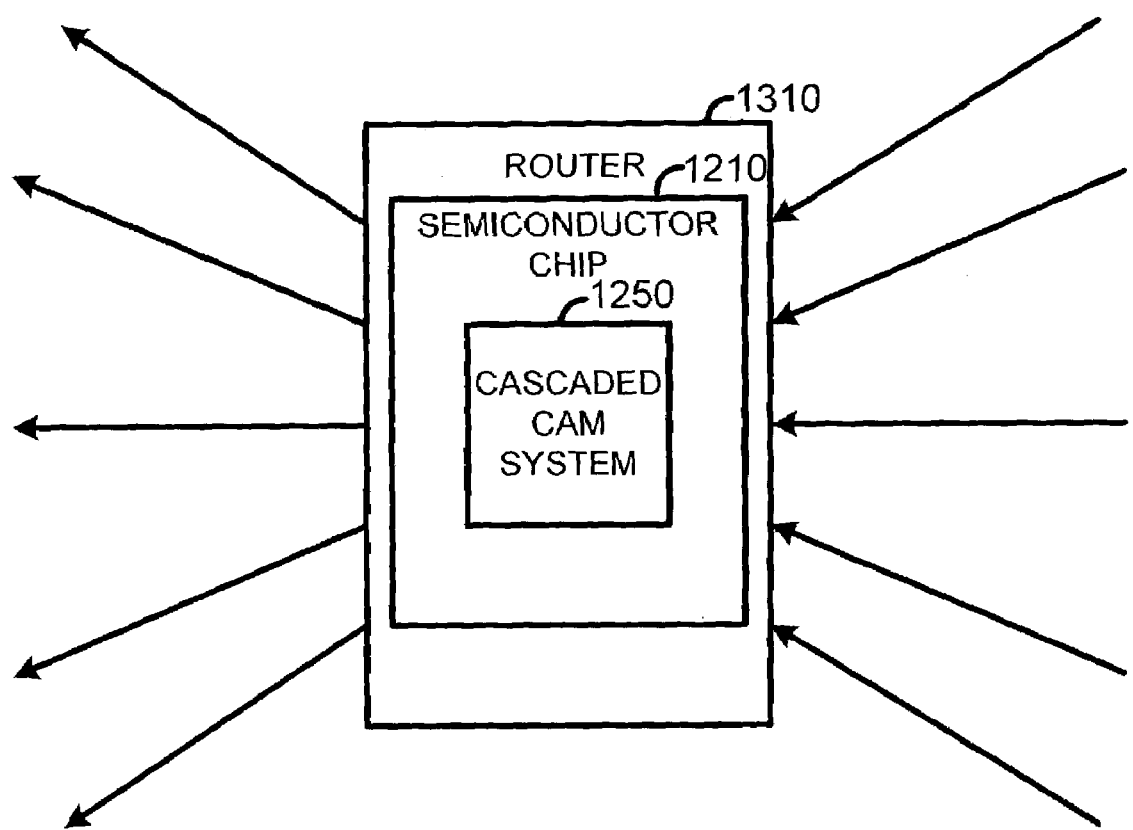
FIG. 15 is a schematic diagram of a router employing the CAM device of FIG. 6 or 12 as part of a cascaded CAM system, in accordance with another exemplary embodiment of the invention.

FIG. 15 is a simplified block diagram of a router 1310 as may be used in a communications network, such as, e.g., part of the Internet backbone. The router 1310 contains a plurality of input lines and a plurality of output lines. When data is transmitted from one location to another, it is sent in a form known as a packet. Oftentimes, prior to the packet reaching its final destination, that packet is first received by a router, or some other device. The router 1310 then decodes that part of the data identifying the ultimate destination and decides which output line and what forwarding instructions are required for the packet.

Generally, CAMs are very useful in router applications because historical routing information for packets received from a particular source and going to a particular destination is stored in the CAM of the router. As a result, when a packet is received by the router 1310, the router already has the forwarding information stored within its CAM. Therefore, only that portion of the packet that identifies the sender and recipient need be decoded in order to perform a search of the CAM to identify which output line and instructions are required to pass the packet onto a next node of its journey.

Still referring to FIG. 15, router 1310 contains the added benefit of employing a semiconductor memory chip 1210 containing a cascaded CAM system 1250, such as that depicted in FIG. 13. Therefore, not only does the router benefit from having a CAM but also benefits by having a cascaded CAM system, in accordance with an exemplary embodiment of the invention.

While the invention has been described in detail in connection with preferred embodiments known at the time, it should be readily understood that the invention is not limited to the disclosed embodiments. Rather, the invention can be modified to incorporate any number of variations, alterations, substitutions, or equivalent arrangements not heretofore described, but which are commensurate with the spirit and scope of the invention. For example, different approaches can be taken to implement communication between the CAM devices, or between the CAM devices and the external cascade device 1092. Further, the specification refers to the highest priority CAM device with a match outputting address information corresponding to the location of the stored data that matches the comparand data, but other information maybe provided as well. For example, the CAM device may output the stored data that matches the operand, a match flag signal, multi-match signal, or other system information. Additionally, the component circuits described in FIGS. 12-14 relate to internally and externally cascaded CAM systems. Accordingly, the invention is not limited by the foregoing description or drawings, but is only limited by the scope of the appended claims.

What is claimed as new and desired to be protected by Letters Patent of the United States is:

1. A content addressable memory (CAM) device comprising:
    a match priority encoder for determining the highest priority CAM device having a match in a CAM system within which said CAM device is configured to operate, said match priority encoder configured to receive match information regarding at least one other CAM device in said CAM system from an external priority device, said match priority encoder also configured to receive said match information from said at least one other CAM device, said match priority encoder also configured to receive a global identification signal identifying a CAM device in said CAM system having a highest priority match; and
    a second stage priority encoder for determining whether said CAM device is the CAM device having a highest priority match, said second stage priority encoder switchably coupled to a first stage priority encoder for receiving said match information, said second stage priority encoder also switchably coupled to said external priority device for receiving said match information; wherein said second stage priority encoder configured to determine whether said CAM device is the CAM device having a highest priority match based on whether said global identification signal is substantially equivalent to the global identification of said CAM device.

2. A content addressable memory (CAM) device, comprising:
    a match priority encoder for determining the highest priority CAM device having a match in a CAM system within which said CAM device is configured to operate, said match priority encoder configured to receive match information regarding at least one other CAM device in said CAM system from an external priority device, said match priority encoder also configured to receive said match information from said at least one other CAM device, said match priority encoder also configured to receive a global identification signal identifying a CAM device in said CAM system having a highest priority match, wherein said CAM device is programmed with a unique identifier.

3. A content addressable memory (CAM) device, comprising: a match priority encoder for determining the highest priority CAM device having a match in a CAM system within which said CAM device is configured to operate, said match priority encoder configured to receive match information regarding at least one other CAM device in said CAM system from an external priority device, said match priority encoder also configured to receive said match information from said at least one other CAM device; and a storage location coupled to said match priority encoder, wherein said match priority encoder configured to provide a logic signal to said storage location based on said match information, said storage location for providing data stored in its storage location to a downstream circuit in response to said logic signal from said match priority encoder, said storage location configured to operate in a first-in, first-out manner wherein said match priority encoder also configured to determine whether said match information corresponds to a first valid data set.

4. A content addressable memory (CAM) device, comprising:
    a match priority encoder for determining the highest priority CAM device having a match in a CAM system within which said CAM device is configured to operate, said match priority encoder configured to receive match information regarding at least one other CAM device in said CAM system from an external priority device, said match priority encoder also configured to receive said match information from said at least one other CAM device; and
    a storage location coupled to said match priority encoder, wherein said match priority encoder configured to provide a logic signal to said storage location based on said match information, said storage location for providing data stored in its storage location to a downstream circuit in response to said logic signal from said match priority encoder, said storage location configured to operate in a first-in, first-out manner, wherein said match priority encoder also configured to determine whether said match information corresponds to a first invalid data set.

5. A content addressable memory (CAM) device, comprising
    a match priority encoder for determining the highest priority CAM device having a match in a CAM system within which said CAM device is configured to operate; and
    a storage location coupled to said match priority encoder, wherein said match priority encoder is configured to provide a logic signal to said storage location based on a match information, said storage location for providing data stored in its storage location to a downstream circuit in response to said logic signal from said match priority encoder,
    wherein said match priority encoder is configured to determine whether said match information corresponds to a first valid data set.

6. A content addressable memory (CAM) device, comprising:
a match priority encoder for determining the highest priority CAM device having a match in a CAM system within which said CAM device is configured to operate; and
a storage location coupled to said match priority encoder, wherein said match priority encoder is configured to provide a logic signal to said storage location based on a match information, said storage location for providing data stored in its storage location to a downstream circuit in response to said logic signal from said match priority encoder,
wherein said match priority encoder is configured to determine whether said match information corresponds to a first invalid data set.

7. An external priority device, comprising:
a global identification circuit for providing a global identification signal to a CAM device, said global identification circuit further comprising:
a global priority encoder for determining a CAM device having a highest priority match, said global priority encoder configured to receive a match information from said CAM device and configured to receive said match information from said at least one other CAM device; and
a global address encoder for determining said global identification signal identifying a CAM device having a highest priority match, said global address encoder coupled to said global priority encoder.

8. The external priority device of claim 7, further comprising:
a global match flag circuit for providing a global match flag signal to said CAM device, said global match flag circuit configured to receive said match information from said CAM device and configured to receive said match information from said at least one other CAM device, said global match flag circuit configured to determine said global match flag signal based on said match information.

9. The external priority device of claim 7, further comprising: a global multi-match circuit for providing a global multi-match signal
to said CAM device, said global multi-match circuit configured to receive said match information from said CAM device and configured to receive said match information from said at least one other CAM device, said global multi-match circuit configured to determine said global multi-match signal based on said match information.

10. A content addressable memory (CAM) system, comprising:
a plurality of coupled CAM devices, each of said plurality of CAM devices configured to receive compared data to be compared with data stored by such CAM device, wherein each of said plurality of CAM devices comprises:
a match priority encoder for determining the highest priority CAM device having a match in said CAM system, said match priority encoder being configured to receive match information regarding at least one other CAM device in said CAM system from an external priority device, said match priority encoder also being configured to receive said match information from said at least one other CAM device,
wherein said match priority encoder is configured to receive a global identification signal identifying a CAM device in said CAM system having a highest priority match.

11. The CAM system of claim 10, further comprising:
a storage location coupled to said match priority encoder for receiving a signal from said match priority encoder when said CAM device is said CAM device in said CAM system having the highest priority match.

12. The CAM system of claim 10, wherein said external priority device transmits said global identification signal to said match priority encoder.

13. The CAM system of claim 10, further comprising:
a second stage priority encoder for determining whether said CAM device is the CAM device having a highest priority match, said second stage priority encoder switchably coupled to a first stage priority encoder for receiving said match information, said second stage priority encoder also switchably coupled to said external priority device for receiving said match information.

14. The CAM system of claim 13, wherein said second stage priority encoder is configured to determine whether said CAM device is the CAM device having a highest priority match based on whether said global identification signal is substantially equivalent to the global identification of said CAM device.

15. A content addressable memory (CAM) system, comprising:
a plurality of coupled CAM devices, each of said plurality of CAM devices configured to receive compared data to be compared with data stored by such CAM device, wherein each of said plurality of CAM devices comprises:
a match priority encoder for determining the highest priority CAM device having a match in said CAM system, said match priority encoder being configured to receive match information regarding at least one other CAM device in said CAM system from an external priority device, said match priority encoder also being configured to receive said match information from said at least one other CAM device, wherein said match priority encoder is configured to receive a global identification signal identifying a CAM device in said CAM system having a highest priority match, said match priority encoder further comprising:
a first stage priority encoder switchably coupled to a second stage priority encoder, said first stage priority encoder configured to receive said match information from said at least one other CAM device, said first stage priority encoder configured to determine a global identification signal identifying a CAM device of said CAM system having a highest priority match, said first stage priority encoder also configured to provide said match information to said second stage priority encoder.

16. A content addressable memory (CAM) system, comprising:
a plurality of coupled CAM devices, each of said plurality of CAM devices comprising a match priority encoder configured to receive compared data from an external priority device to be compared with data stored by such CAM device, wherein said external priority device comprises:
a global identification circuit for providing a global identification signal to said plurality of CAM devices, said global identification circuit further comprising: a global priority encoder for determining a CAM device from said plurality of CAM devices having a highest priority match, said global priority encoder configured to receive a match information from said CAM device and configured to receive said match information from said at least one other CAM device;

a global address encoder for determining said global identification signal identifying a CAM device having a highest priority match, said global address encoder coupled to said global priority encoder; and a global match flag circuit for providing a global match flag signal to said CAM device, said global match flag circuit configured to receive said match information from said CAM device and configured to receive said match information from said at least one other CAM device, said global match flag circuit configured to determine said global match flag signal based on said match information.

17. A content addressable memory (CAM) system, comprising:

a plurality of coupled CAM devices, each of said plurality of CAM devices comprising a match priority encoder configured to receive compared data from an external priority device to be compared with data stored by such CAM device, wherein said external priority device comprises:

a global identification circuit for providing a global identification signal to said plurality of CAM devices, said global identification circuit further comprising:

a global priority encoder for determining a CAM device from said plurality of CAM devices having a highest priority match, said global priority encoder configured to receive a match information from said CAM device and configured to receive said match information from said at least one other CAM device;

a global address encoder for determining said global identification signal identifying a CAM device having a highest priority match, said global address encoder coupled to said global priority encoder; and a global multi-match circuit for providing a global multi-match signal to said CAM device, said global multi-match circuit configured to receive said match information from said CAM device and configured to receive said match information from said at least one other CAM device, said global multi-match circuit configured to determine said global multi-match signal based on said match information.

18. A semiconductor chip, comprising:

a plurality of content addressable memory devices, each of said content addressable memory devices comprising:

a match priority encoder for determining the highest priority CAM device having a match in a CAM system within which said CAM device is configured to operate, said match priority encoder configured to receive match information regarding at least one other CAM device on said CAM system from an external priority device, said match priority encoder also configured to receive said match information from said at least one other CAM device, said match priority encoder also configured to receive a global identification signal identifying a CAM device of said CAM system having a highest priority match; and a second stage priority encoder for determining whether said CAM device is the CAM device having a highest priority match, said second stage priority encoder switchably coupled to a first stage priority encoder for receiving said match information, said second stage priority encoder also switchably coupled to said external priority device for receiving said match information, wherein said second stage priority encoder is configured to determine whether said CAM device is the CAM device having a highest priority match based on whether said global identification signal is substantially equivalent to the global identification of said CAM device.

19. A router, comprising:

a content addressable memory (CAM) system, said CAM system comprising:

a match priority encoder for determining the highest priority CAM device having a match in said CAM system, said match priority encoder being configured to receive match information regarding at least one other CAM device on said CAM system from an external priority device, said match priority encoder also being configured to receive said match information from said at least one other CAM device, said match priority encoder also configured to receive a global identification signal identifying a CAM device of said CAM system having a highest priority match; and a second stage priority encoder for determining whether said CAM device is the CAM device having a highest priority match, said second stage priority encoder switchably coupled to a first stage priority encoder for receiving said match information, said second stage priority encoder also switchably coupled to said external priority device for receiving said match information, wherein said second stage priority encoder is configured to determine whether said CAM device is the CAM device having a highest priority match based on whether said global identification signal is substantially equivalent to the global identification of said CAM device.

20. A method of operating a CAM device in a system, the method comprising:

determining in what mode a CAM device is operating;

receiving match information from at least one other CAM device if said CAM device is operating in a first mode;

receiving match information regarding at least one other CAM device in said CAM system from an external priority device if said CAM device is operating in a second mode; and determining the highest priority CAM device having a match in said CAM system.

21. The method of claim 20, further comprising:

receiving a global identification signal identifying a CAM device in said CAM system having a highest priority match.

22. The method of claim 21, further comprising:

storing a signal received from said match priority encoder when said CAM device is said CAM device in said CAM system having the highest priority match.

23. The method of claim 21, wherein said act of receiving comprises transmitting said global identification signal from said external priority device to said match priority encoder.

24. The method of claim 21, further comprising:

determining whether said CAM device is the CAM device having a highest priority match.

25. The method of claim 24, wherein said act of determining comprises determining whether said global identification signal is substantially equivalent to the global identification of said CAM device.

26. The method of claim 21, further comprising:
receiving said match information at a global priority encoder;
determining a CAM device having a highest priority match; and
determining said global identification signal identifying said CAM device having a highest priority match.

27. The method of claim 26, further comprising:
receiving said match information at a global match flag circuit; and
providing a global match flag signal to said CAM device.

28. The method of claim 27, wherein said external priority device further comprises:
receiving said match information at a multi-match flag circuit of said external priority device; and
providing a multi-match flag signal to said CAM device.

29. The method of claim 20, wherein said match information comprises a match flag signal.

30. The method of claim 20, wherein said match information comprises a multi-match signal.

31. The method of claim 20, further comprising:
receiving at a first stage priority encoder said match information from said at least one other CAM device;
determining a global identification signal identifying a CAM device of said CAM system having a highest priority match by said first stage priority encoder; and
providing said match information to said second stage priority encoder by said first stage priority encoder.

* * * * *

UNITED STATES PATENT AND TRADEMARK OFFICE
CERTIFICATE OF CORRECTION

PATENT NO.         : 7,257,670 B2                                      Page 1 of 1
APPLICATION NO. : 10/463540
DATED              : August 14, 2007
INVENTOR(S)        : Feldmeier It is certified that error appears in the above-identified patent and that said Letters Patent is hereby corrected as shown below:

On the Title page, in Item (75), in "Inventor", in column 1, line 1, delete "Redwood City," and insert -- Los Gatos, --, therefor.

On the Title page, in Item (57), under "Abstract", in column 2, line 9, delete "systems" and insert -- systems, --, therefor.

In column 16, line 25 (Approx.), in Claim 3, delete "manner" and insert -- manner, --, therefor.

Signed and Sealed this

Twentieth Day of November, 2007

JON W. DUDAS
*Director of the United States Patent and Trademark Office*